(12) United States Patent
Choi

(10) Patent No.: US 7,131,042 B2
(45) Date of Patent: Oct. 31, 2006

(54) SEMICONDUCTOR DEVICE AND METHOD FOR TESTING THE SAME

(75) Inventor: Jung-Hwan Choi, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 574 days.

(21) Appl. No.: 10/421,533

(22) Filed: Apr. 21, 2003

(65) Prior Publication Data
US 2004/0111657 A1    Jun. 10, 2004

(30) Foreign Application Priority Data
Dec. 6, 2002    (KR)    ................ 10-2002-0077348

(51) Int. Cl.
*G01R 31/28*    (2006.01)
(52) U.S. Cl. .................................... 714/724
(58) Field of Classification Search ................ 714/724, 714/726, 727; 324/765
See application file for complete search history.

(56) References Cited

U.S. PATENT DOCUMENTS 6,163,867 A    12/2000    Miller et al.
6,272,657 B1    8/2001    Dhaliwal
6,317,352 B1    11/2001    Halbert et al.
6,348,811 B1    2/2002    Haycock et al.
6,505,317 B1*    1/2003    Smith et al. ................ 714/738
2002/0079926 A1    6/2002    Haycock et al.

FOREIGN PATENT DOCUMENTS

EP    07181227    7/1995
EP    0838689    4/1998
JP    07181227    7/1995

OTHER PUBLICATIONS

English language abstract of Japanese Patent No. 07181227.

* cited by examiner

*Primary Examiner*—James C. Kerveros
(74) *Attorney, Agent, or Firm*—Marger Johnson & McCollom, P.C.

(57) ABSTRACT

Test board configurations and test method for semiconductor devices with simultaneous bi-directional (SBD) data ports are disclosed. The devices have two SBD data ports with a pass mode that relays data between the ports. Significantly, each device contains configurable switching elements that allow a test mode, wherein unidirectional input/output data on one SBD data port is mapped to bi-directional data on the other SBD data port. This allows device testing with automated test equipment that employs unidirectional data signaling, and yet allows such test equipment to test the SBD capability of such devices.

20 Claims, 12 Drawing Sheets

SEMICONDUCTOR DEVICE AND METHOD FOR TESTING THE SAME

BACKGROUND OF THE INVENTION

1. Field of the Invention

The present invention relates to semiconductor devices employing simultaneous bi-directional transmission, and methods and apparatus for testing such devices.

2. Description of the Related Art

Semiconductor devices such as processors, controllers, memory devices, etc., are commonly equipped with data transceivers that allow them to receive and transmit digital signals. Conventionally, such transceivers are reconfigurable to either receive or transmit data across an attached transmission line. Recently, devices with simultaneous bi-directional (SBD) transmit/receive capability have received increased interest. As the name alludes to, SBD transceivers have the capability to receive and transmit digital data during the same clock cycle, on the same transmission line.

FIG. 1 shows a conventional SBD connection between two semiconductor devices 20 and 40. Devices 20 and 40 contain, respectively, SBD transceivers 22 and 42. SBD transceiver 22 contains a data driver 24 and a data receiver 26. An internal data signal to be driven, Dout1, is supplied as an input to driver 24 and as a control signal to receiver 26. The output of driver 24 is coupled to the input of receiver 26. Receiver 26 also receives two reference voltages, VrefH and VrefL, which it uses for comparisons, as will be explained shortly. The output of receiver 26 is a data input, Din1, to device 20.

Transceiver 42 of device 40 is preferably matched to transceiver 22 of device 20. Transceiver 42 contains a driver 44 and a receiver 46 connected in an identical configuration as the driver and receiver of transceiver 22. Driver 44 takes its input from an internal data signal Dout2, and receiver 46 generates a data input Din2.

Semiconductor devices 20 and 40 can be connected to each other in the configuration shown in FIG. 1, by connecting the outputs of drivers 24 and 44 to a transmission line 30. Note that in this configuration, the drive state of both driver 24 and driver 44 determine the bit line voltage $V_{BL}$ on transmission line 30. A common reference voltage generator 32 supplies Vref1 and VrefL to both circuits.

FIG. 2 contains waveforms illustrating the simultaneous exchange of data between devices 20 and 40 over transmission line 30. Dout1 is high during time periods T1, T2, and T5. Dout2 is high during time periods T1, T3, and T5. Consequently, during T1, drivers 24 and 44 both pull the bit line voltage $V_{BL}$ high, e.g., to an upper rail voltage $V_h$. During T2, driver 24 attempts to pull bit line voltage $V_{BL}$ high and driver 44 attempts to pull $V_{BL}$ low, e.g., to a lower rail voltage $V_l$. With matched drivers, $V_{BL}$ will assume an approximate voltage $V_{mid}$, halfway between upper rail voltage $V_h$ and the lower rail voltage $V_l$. During T3, both drivers reverse, and $V_{BL}$ stays at $V_{mid}$. During T4, both drivers pull $V_{BL}$ low, to $V_l$.

Receivers 26 and 46 determine the drive state of the other device's driver during each time period by selecting an appropriate comparison voltage, based on the known drive state of their own driver. For instance, during T1 and T2, receiver 26 knows that driver 24 is driving line 30 high—thus the only two possible values of $V_{BL}$ are $V_h$ (if driver 44 is also driving line 30 high) and $V_{mid}$ (if driver 44 is driving line 30 low). Thus during T1 and T2, receiver 26 compares $V_{BL}$ to VrefH, which is midway between $V_h$ and $V_{mid}$, and is able to determine that driver 44 was sending a high voltage during T1 and a low voltage during T2. Similarly, during T3 and T4, receiver 26 knows that driver 24 is driving line 30 low, and compares $V_{BL}$ to VrefL. Receiver 46 operates similarly, but based on the known state of driver 44, to determine the drive state of driver 24.

One use of SBD transmission technology is in a point-to-point memory system such as in the partial system depicted in FIG. 3. In such a memory system, devices can communicate with an upstream device and a downstream device over separate connections. For instance, device 20 can be a memory controller, and devices 40 and 60 can be two memory devices connected to the controller. As the controller initiates memory operations, it is upstream of device 40. And as device 40 is interposed between devices 60 and 20, device 40 is upstream of device 60. Address and control signal buses used to control memory operations are not shown in FIG. 3.

Although such a configuration can have any practicable data bus width, FIG. 3 shows a bus width of four bits. One bus consists of point-to-point bit lines 30-0, 30-1, 30-2, and 30-3, with device 20 as an upstream device and device 40 as a downstream device. A second bus consists of point-to-point bit lines 50-0, 50-1, 50-2, and 50-3, with device 40 as an upstream device and device 60 as a downstream device.

Device 40 has an upstream port consisting of four upstream SBD transceivers 42-0, 42-1, 42-2, and 42-3, and a downstream port consisting of four downstream SBD transceivers 48-0, 48-1, 48-2, and 48-3. Within device 40, upstream SBD transceiver is connected to a corresponding downstream SBD transceiver. Thus data received, e.g., at transceiver 42-0, is both a data input Din0 to device 40 and an input Ddn0 to the downstream driver of transceiver 48-0. And data Dup0 received, e.g., at transceiver 48-0, is multiplexed with device 40 output data Dout0 at a multiplexer 45-0, for input to the upstream driver of transceiver 42-0.

Devices 20 and 40 communicate n bits of SBD data as previously described, with the bit lines 30-n working in parallel. Depending on the memory operation, however, the data received by device 40 may be destined either for device 40 or for a downstream device (e.g., device 60), and the data transmitted by device 40 may be either internal data or data received from device 60. Thus devices 20 and 60 communicate data between each other using their respective point-to-point buses to device 40, and device 40 forwards data traffic between its upstream and downstream ports in a pass mode.

DETAILED DESCRIPTION OF THE EMBODIMENTS

Generally, automatic test equipment (ATE) is used to cull bad semiconductor devices from a lot of semiconductor devices. An ATE station is connected to a device to be tested via a test board. The ATE station is programmable, such that it can be configured to apply test signals to the inputs of a device under test (DUT), and receive signals from the outputs of the DUT. For instance, if the DUT is a memory device, the ATE station might emulate memory controller address and control signaling to write a certain bit pattern to the memory device, and then read the bit pattern back to see if what was written was stored and retrieved successfully.

Conventional ATE stations do not support SBD transfers. Even if such stations supported SBD transfers, the stations would have to use SBD transceivers that were matched to the SBD transceivers of a DUT, or else SBD transfers would be error-prone or impossible. Accordingly, it is desirable that test communications between an ATE station and a DUT remain unidirectional, even for DUTs with SBD data ports. And yet the SBD capability of a DUT is critical to device operation, and must be tested.

The described embodiments provide for testing of SBD devices, including the SBD capability of such devices, in an environment that allows for unidirectional communication between a device configuration under test and an ATE station. As will be illustrated, the invention encompasses various methods for testing such a device configuration, integrated circuit test boards, and semiconductor devices amenable to testing using the described methods and test boards. One concept found throughout these embodiments is an ability to configure an SBD semiconductor device such that two data port pads can be used in a test mode to respectively receive one unidirectional data signal and transmit another unidirectional data signal, with these two data signals coupled respectively to/from a third pad that operates as an SBD pad. This concept will be clarified as the following embodiments are explored in detail.

Figure 1:
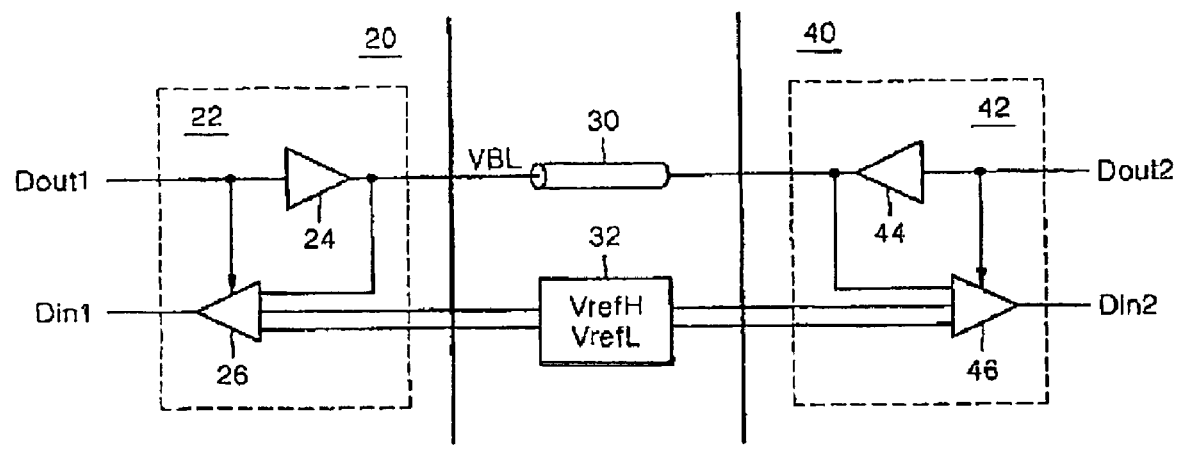
FIG. 1 illustrates two prior-art SBD transceivers, on separate semiconductor devices, connected by a transmission line.
Figure 2:
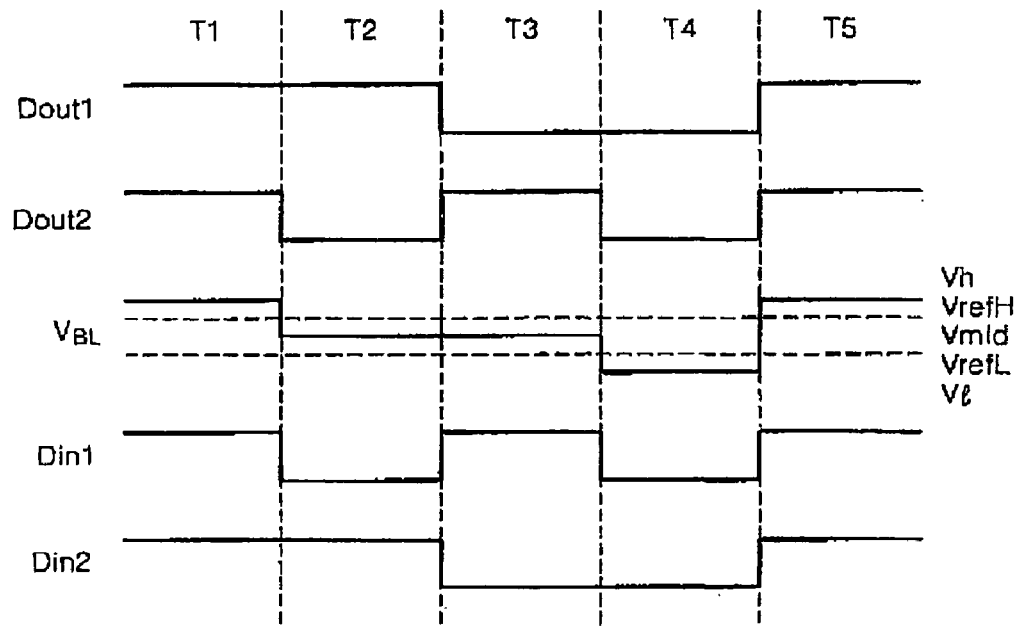
FIG. 2 illustrates data input value/output value relationships for the transceivers of FIG. 1.
Figure 3:
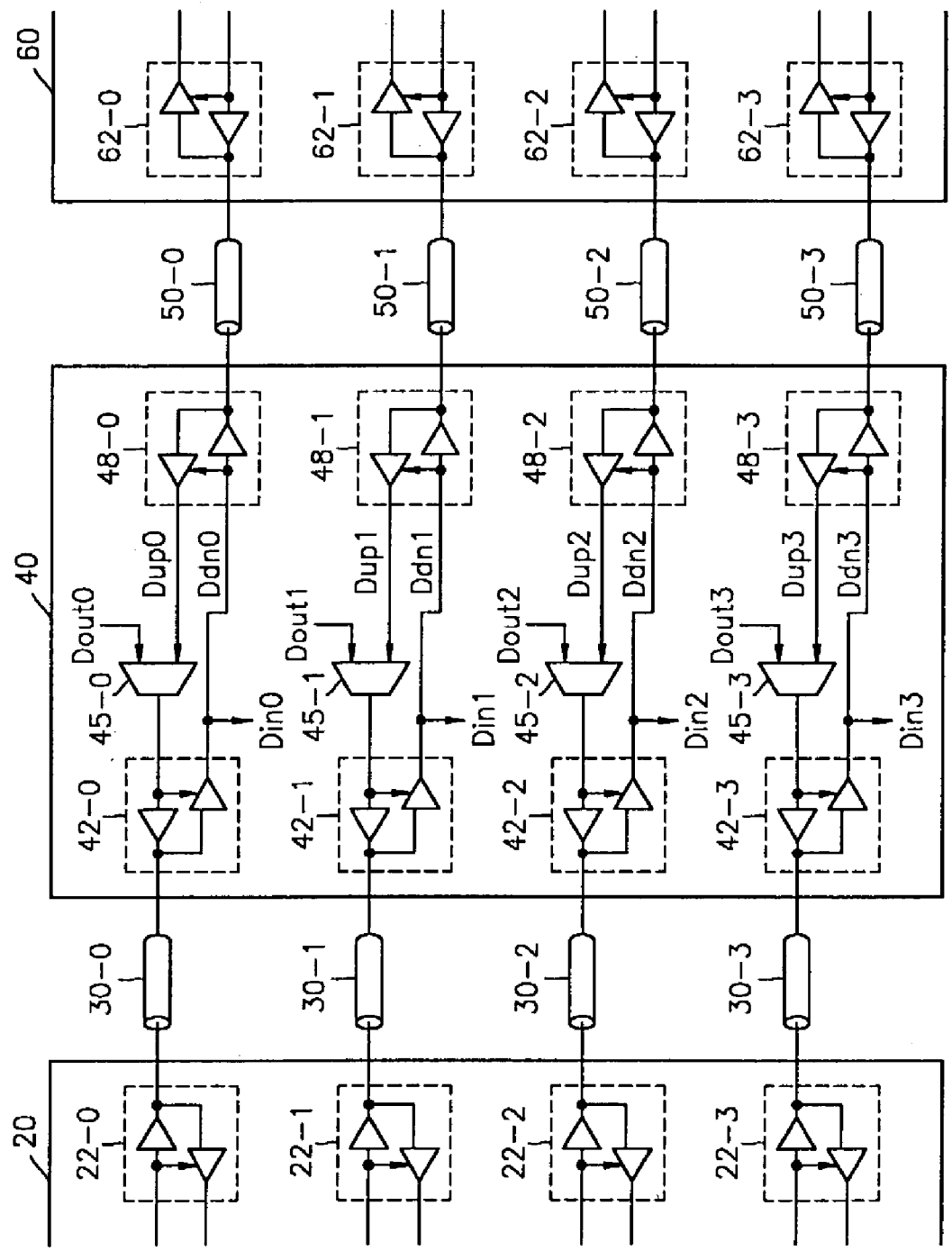
FIG. 3 shows a prior art semiconductor device with a pass-through data port, allowing the device to connect two other devices over point-to-point data buses.
Figure 4:
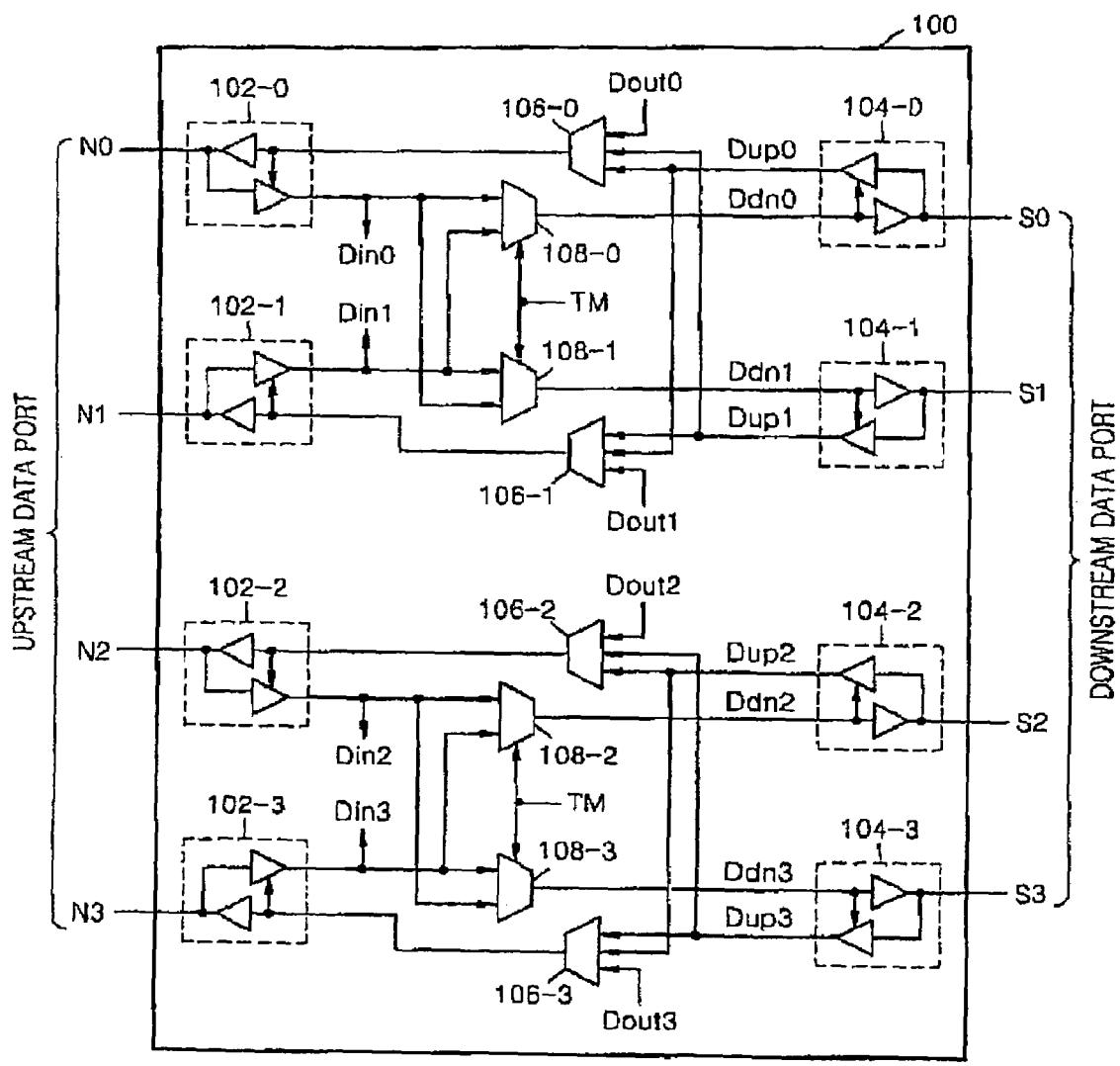
FIG. 4 is a block diagram for a semiconductor device according to an embodiment of the invention.

FIG. 4 illustrates a semiconductor device 100 according to one embodiment of the present invention. A north, or upstream, SBD data port comprises pads N0, N1, N2, and N3, connected respectively to SBD transceivers 102-0, 102-1, 102-2, and 102-3. A south, or downstream, SBD data port comprises pads S0, S1, S2, and S3, connected respectively to SBD transceivers 104-0, 104-1, 104-2, and 104-3. As with prior art devices, data input to the device and data output from the device utilize the north or upstream port in a normal mode. A pass mode uses a pass-through path that connects the north port with the south port in a one-to-one pad correspondence, e.g., transceiver 102-0 is connected to transceiver 104-0, transceiver 102-1 is connected to transceiver 104-1, etc. However, unlike prior art devices, this path is not fixed—at least one second pad correspondence is possible that is useful for testing, and is activated in a test mode.

Multiple pass-through paths are possible with device 100 due to the inclusion of cross-connecting switching elements that allow different correspondences between north and south port pads. Significantly for unidirectional test signaling, the switching elements can be configured to pass data in various two-pad-to-one-pad mappings. For instance, consider pads N0, N1, S0, and S1. Transceivers 102-0 and 102-1 both supply received signals to multiplexers (MUXs) 108-0 and 108-1. A test mode signal TM determines which input forms the output for each MUX. Thus either Din0 or Din1 can be selected as signal Ddn0, to be driven externally by transceiver 104-0. Likewise, either Din0 or Din1 can be selected as signal Ddn1, to be driver externally by transceiver 104-1.

Similarly, MUXs 106-0 and 106-1 determine one of multiple sources to be driven externally by transceivers 102-0 and 102-1, respectively. MUX 106-0, e.g., can select between Dup0, Dup1, and Dout0 (output data supplied from the chip core).

A similar switching element arrangement connects north port pads N2 and N3 with south port pads S2 and S3. For devices with larger bus widths, the switching element configuration can be repeated for each set of two north and two south ports. Note that although multiplexers are illustrated in FIG. 4 as the switching elements, individual switches can accomplish the same functionality, or a subset of this functionality.

With the preceding description of a semiconductor device embodiment in place, several device configurations will now be shown and described. Each of these device configurations allows some (or all) SBD pads of a DUT to be exercised in SBD mode as an internal SBD port, using other SBD pads as an external unidirectional port.

Figure 5A:
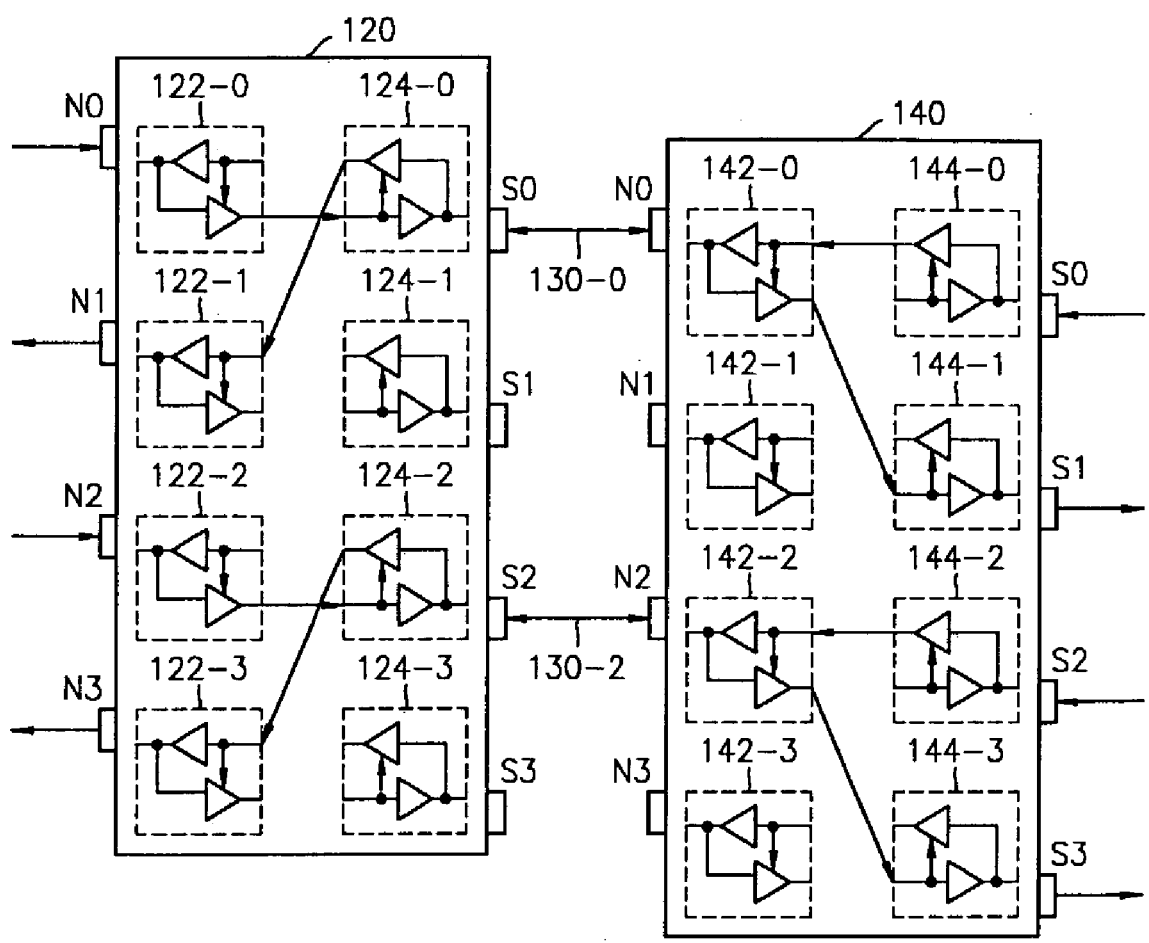
FIGS. 5A and 5B show device testing configurations according to an embodiment of the invention, for two communicating SBD devices.
Figure 5B:
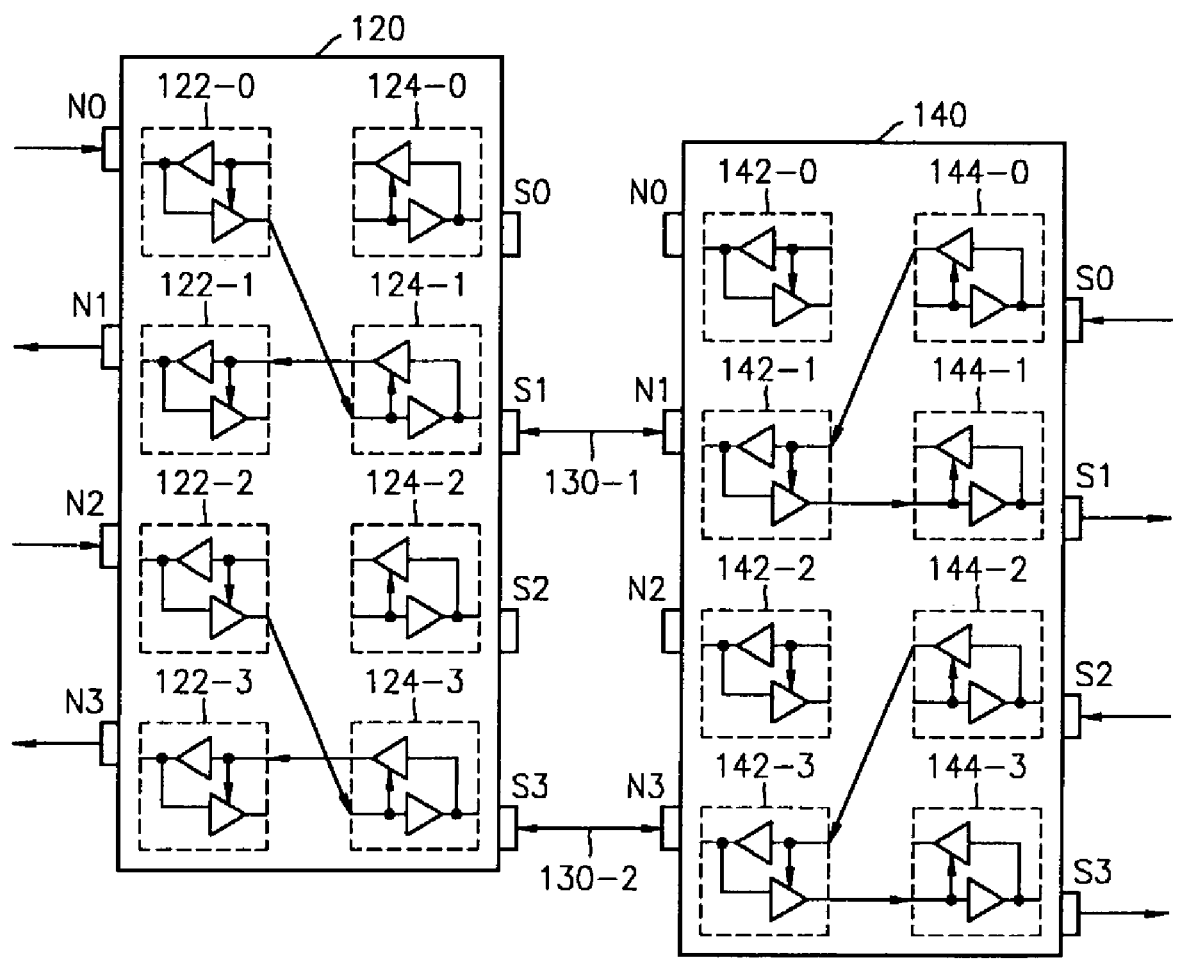

FIGS. 5A and 5B illustrate a first device configuration consisting of semiconductor devices 120 and 140. The external data port consists of the north port of device 120 and the south port of device 140. The even-numbered port pads N0 and N2 (device 120) and S0 and S2 (device 140) are configured as a receive port to receive data from an attached tester (not shown). The odd-numbered port pads N1 and N3 (device 120) and S1 and S3 (device 140) are configured as a transmit port to send data to the attached tester.

Two internal data ports are shown. The first internal data port consists of the south port pads of device 120, and the second internal data port consists of the north port pads of device 140. The port pads of the first and second internal data ports are connected by a test board in a one-to-one correspondence, e.g., device 120 port pad S0 connects to device 140 port pad N0 via a bit line 130-0 formal in/on the test board.

In test mode, two test phases are used to conduct an SBD test of the internal data ports. In the first phase, internal data paths in device 120 and 140 are set as shown in FIG. 5A. In the second phase, internal data paths are set as shown in FIG. 5B. Each phase will be explained in turn.

In the first phase, the even-numbered south port pads of device 120 and the even-numbered north port pads of device 140 are tested. Thus in device 120, the internal data paths are configured to pass write data received at N0 and N2, respectively, to S0 and S2 and pass write data received at S0 and S2, respectively, to N1 and N3. In device 140, the internal data paths are configured to pass write data received at S0 and S2, respectively, to N0 and N2 and pass write data received at N0 and N2, respectively, to S1 and S3. This configuration can be done, e.g., by having the ATE set test mode fields in the mode register sets of devices 120 and 140, to configure switching elements such as those shown in FIG. 4.

Once the data path configuration is complete, the ATE writes bit patterns to the designated external port write pads to test the SBD capability of the internal port. For instance, logic zero can be written to device 120 port pads N0 and N2, at the same time that logic one is written to device 140 port pads S0 and S2. This causes transceiver 124-0 to drive a logic zero on bit line 130-0 at the same time that transceiver 142-0 drives a logic one on the same bit line. If transceivers 124-0 and 142-0 are operating correctly, transceiver 124-0 will receive a logic one and transceiver 142-0 will receive a logic zero. The values received by transceivers 124-0 and 142-0 will be internally forwarded to transceivers 122-1 and 144-1, respectively, and driven to the ATE from device 120 port pad N1 and device 140 port pad S1.

As the ATE will normally also exercise the SBD capability for the opposite signal polarity to that just described, the ATE then repeats the above write/read process with a different bit pattern, e.g., logic one written to device 120 port pads N0 and N2 and logic zero written to device 140 port pads S0 and S2. This causes, e.g., transceiver 124-0 to write a logic one and read a logic zero, and transceiver 142-0 to write a logic zero and read a logic one.

Because in this configuration the number of external port unidirectional-mode pads is equal to the number of internal port SBD pads, only half of the SBD pads can be tested simultaneously. The second phase, illustrated in FIG. 5B, tests the other half of the internal port SBD pads. Referring to FIG. 5B, in device 120, the internal data paths are reconfigured to pass write data received at N0 and N2, respectively, to S1 and S3 and pass write data received at S1 and S3, respectively, to N1 and N3. In device 140, the internal data paths are configured to pass write data received at S0 and S2, respectively, to N1 and N3 and pass write data received at N1 and N3, respectively, to S1 and S3. This configuration can be done, e.g., by having the ATE set test mode fields in the mode register sets of devices 120 and 140 to cause a switch from the configuration of FIG. 5A to the configuration of FIG. 5B.

Once the test path reconfiguration is complete, the ATE repeats the previous write/read bit pattern test to test the odd SBD pads S1 and S3 on device 120 and N1 and N3 on device 140. Although only two bit patterns have been described for each phase of the test, those skilled in the art recognize that a variety of bit patterns can be attempted, in varying sequences, during a test.

Assuming that the devices pass the described test, the south port on device 120 and the north port on device 140 have been verified as operational in SBD mode. If both devices are DUTs, swapping device positions in the device configuration and repeating the test can test their other ports. Alternately, one device can be a known good device (KGD). The other device is the device under test, and is fully tested by testing it first in the position of device 120, with a KGD at device 140, and then in the position of device 140, with a KGD at device 120.

Figure 6A:
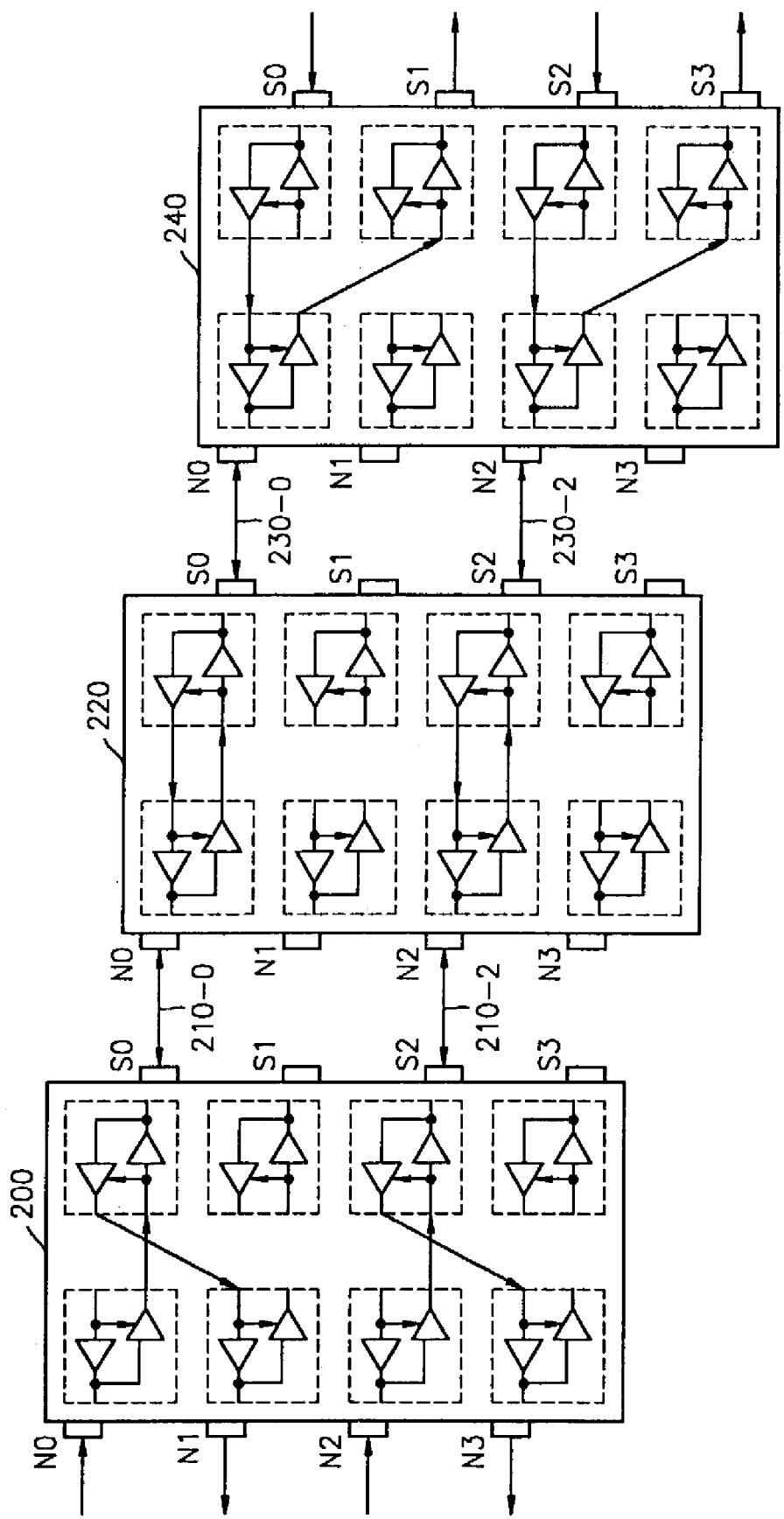
FIGS. 6A and 6B show device testing configurations according to an embodiment of the invention, for three communicating SBD devices.
Figure 6B:
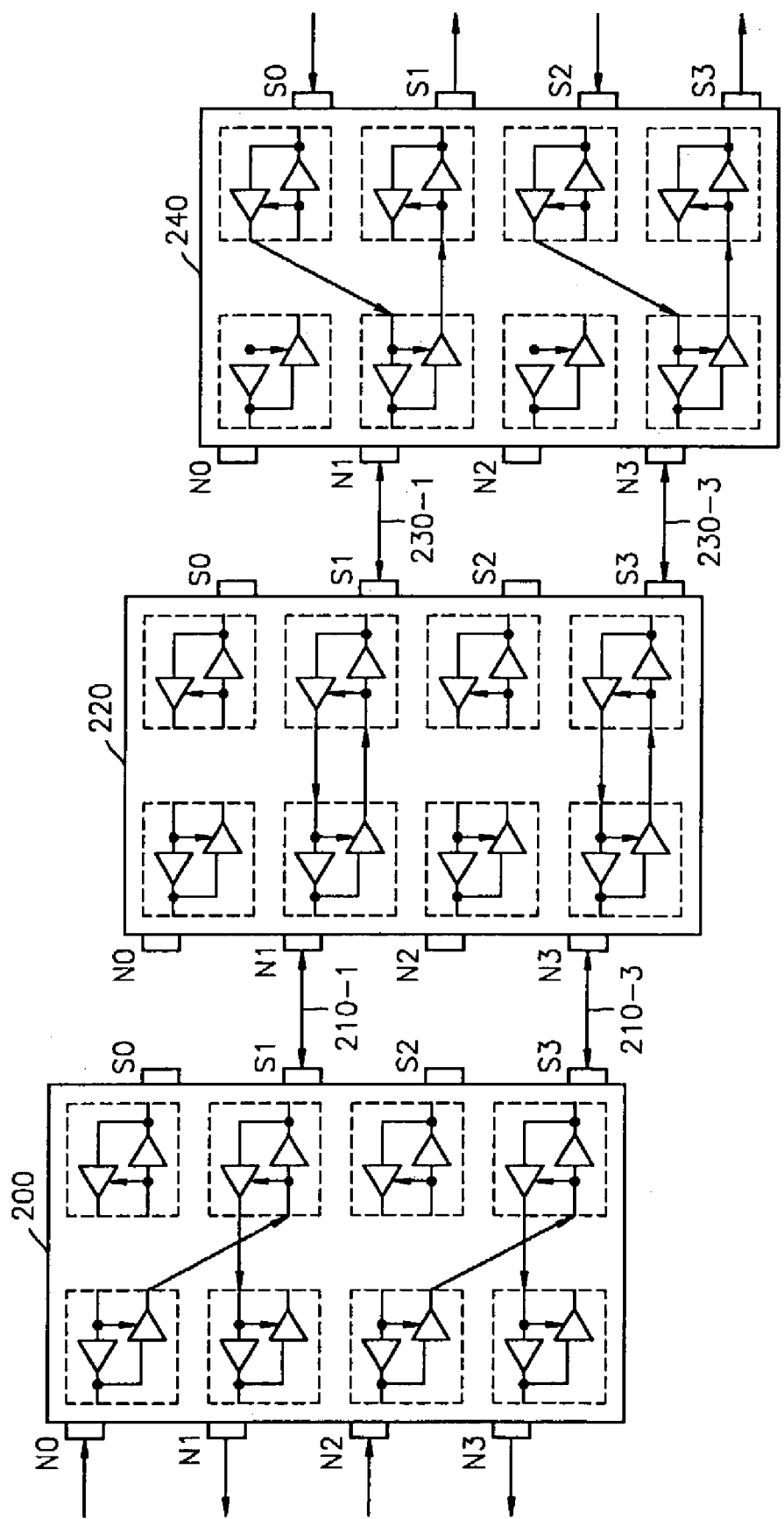

FIGS. 6A and 6B illustrate a second device configuration consisting of semiconductor devices 200, 220, and 240. The external data ports consist of the north port pads of device 200 and the south port pads of device 240. The even-numbered port pads N0 and N2 (device 200) and S0 and S2 (device 240) are configured as receive ports to receive data from an attached tester (not shown). The odd-numbered port pads N1 and N3 (device 200) and S1 and S3 (device 240) are configured as transmit ports to send data to the attached tester.

Four internal data ports exist in the FIG. 6A configuration. The four internal data ports are: the south port of device 200; both the north and south ports of device 220; and the north port of device 240. The south port pads of device 200 and the north port pads of device 220 are connected by a test board in a one-to-one correspondence, e.g., device 200 port pad S0 connects to device 220 port pad N0 via a bit line 210-0. The south port pads of device 220 and the north port pads of device 240 are connected in a one-to-one correspondence as well, e.g., device 220 port pad S0 connects to device 240 port pad N0 via a bit line 230-0.

Like in the previous example, two test mode phases are used to conduct an SBD test of the internal data ports. In the first phase, internal data paths are set as shown in FIG. 6A. In the second phase, internal data paths are set as shown in FIG. 6B. Each phase will be explained in turn.

In the first phase, the even-numbered internal ports are tested. Devices 200 and 240 are configured respectively like devices 120 and 140 in FIG. 5A. Device 220 is configured in a straight pass-through configuration, e.g., port pad N0 communicates bi-directionally with port pad S0, etc. This configuration can be done, e.g., by having the ATE set test mode fields in the mode register sets of devices 200 and 240 (the device 220 configuration may not be a test configuration, but could be).

Once the data path configuration is complete, the ATE proceeds with bit pattern testing as in the prior example to test the even-numbered port pads of the four internal data ports. The path difference from the prior example is internal to the configuration, as the data will pass through one more point-to-point bus than in the prior example.

Once bit pattern testing is complete for this configuration, the ATE proceeds to configure devices 200 and 240 in the configuration shown in FIG. 6B (like the respective configuration of devices 120 and 140 of FIG. 5B) to test the odd-numbered internal port pads, as in the previous example.

At the end of the test cycle, the SBD capability of device 220 has been fully tested. If devices 200 and 240 are KGDs, another candidate device can replace device 220 and the test cycle can be repeated. Alternately, if all devices are DUTs, devices 200 and 240 can be swapped, and a new candidate device inserted in the place of device 220, and the test cycle repeated. This procedure fully tests the SBD capability of device 200, the original and second devices 220, and the device 240, in two test cycles.

Figure 7:
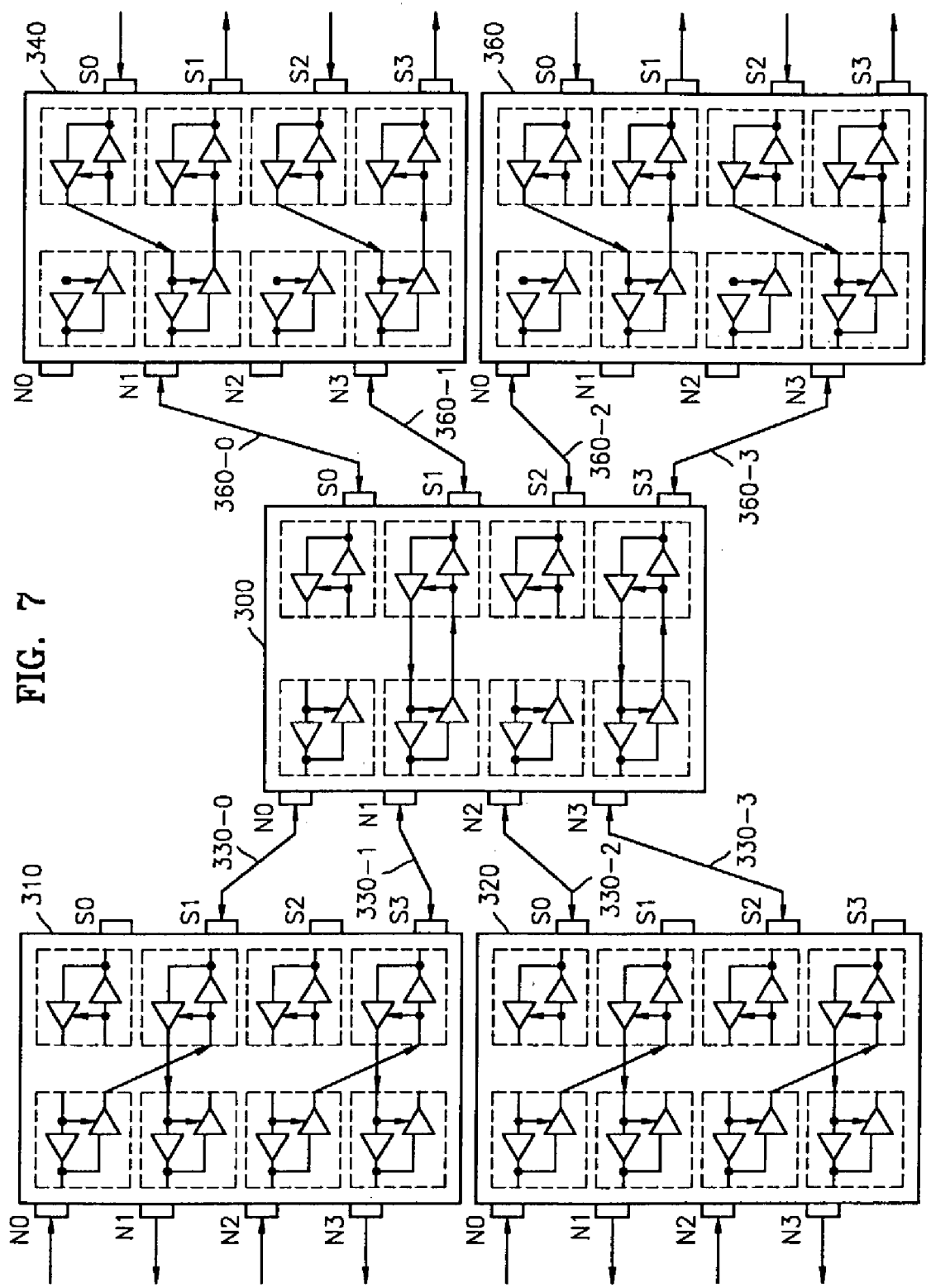
FIG. 7 shows a device configuration according to an embodiment of the invention, for five communicating SBD devices.

FIG. 7 illustrates a third device configuration consisting of five semiconductor devices 300, 310, 320, 340, and 350. The external data ports consist of the north port pads of devices 310 and 320 and the south port pads of devices 340 and 350. The even-numbered port pads N0 and N2 (devices 310 and 320) and S0 and S2 (devices 340 and 350) are configured as receive ports to receive data from an attached tester (not shown). The odd-numbered port pads N1 and N3 (devices 310 and 320) and S1 and S3 (devices 340 and 350) are configured as transmit ports to send data to the attached tester.

Six internal data ports exist in the FIG. 7 configuration. The six internal data ports are: the south port of devices 310 and 320; both the north and south ports of device 300; and the north port of devices 340 and 350. Half of the south port pads of devices 310 and 320, respectively, connect to respective halves of the north port pads of device 300, e.g.: device 310 port pad S1 connects to device 300 port pad N0 via a bit line 330-0; device 310 port pad S3 connects to device 300 port pad N1 via a bit line 330-1; device 320 port pad S0 connects to device 300 port pad N2 via a bit line 330-2; and device 320 port pad S2 connects to device 300 port pad N3 via a bit line 330-3. Similar connections connect half of the north port pads of devices 340 and 350, respectively, to respective halves of the south port pads of device 300, via bit lines 360-0, 360-1, 360-2, and 360-3.

In this example, twice as many external port pads are available as in the previous examples. Accordingly, all of the port pads of device 300 can be tested simultaneously. The data signal input at N0 on device 310, e.g., passes through to port pad S1, is driven to port pad N0 on device 300, passes through to port pad SO, is driven to port pad N1 on device 340, passes through to port pad S1, and is driven to the ATE. At the same time, another data signal input at S0 on device 340 passes through to port pad N1, crosses the first data signal on bit lines 360-0 and 330-0 to port pad S1 on device 310, passes through to port pad N1, and is driven to the ATE. Other ATE inputs and outputs cross similarly for the other external and internal port pads.

One use of the configuration shown in FIG. 7 is with KGD devices for all devices except device 300. Note that half of the internal ports on all KGDs are still available, and could be connected to a second test socket and used to test a second DUT in a similar manner to device 300.

Figure 8A:
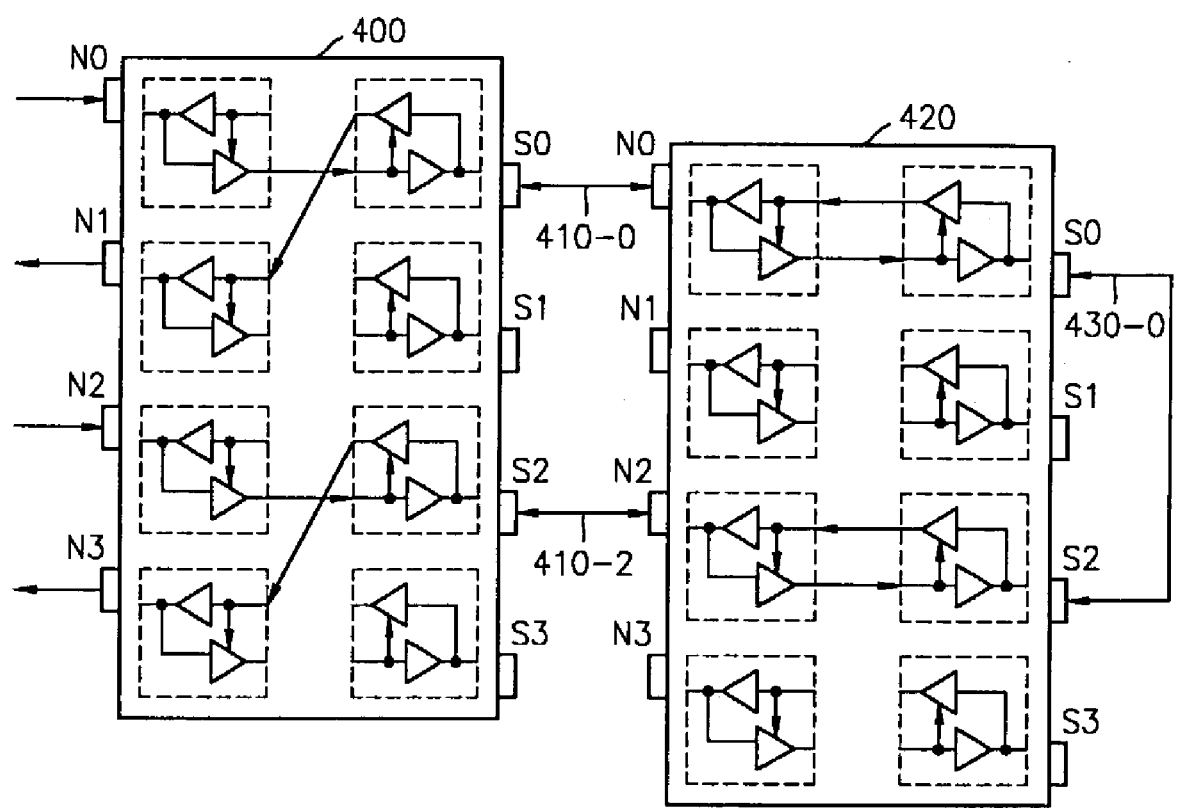
FIGS. 8A and 8B show a second set of device testing configurations according to an embodiment of the invention, for two communicating SBD devices.
Figure 8B:
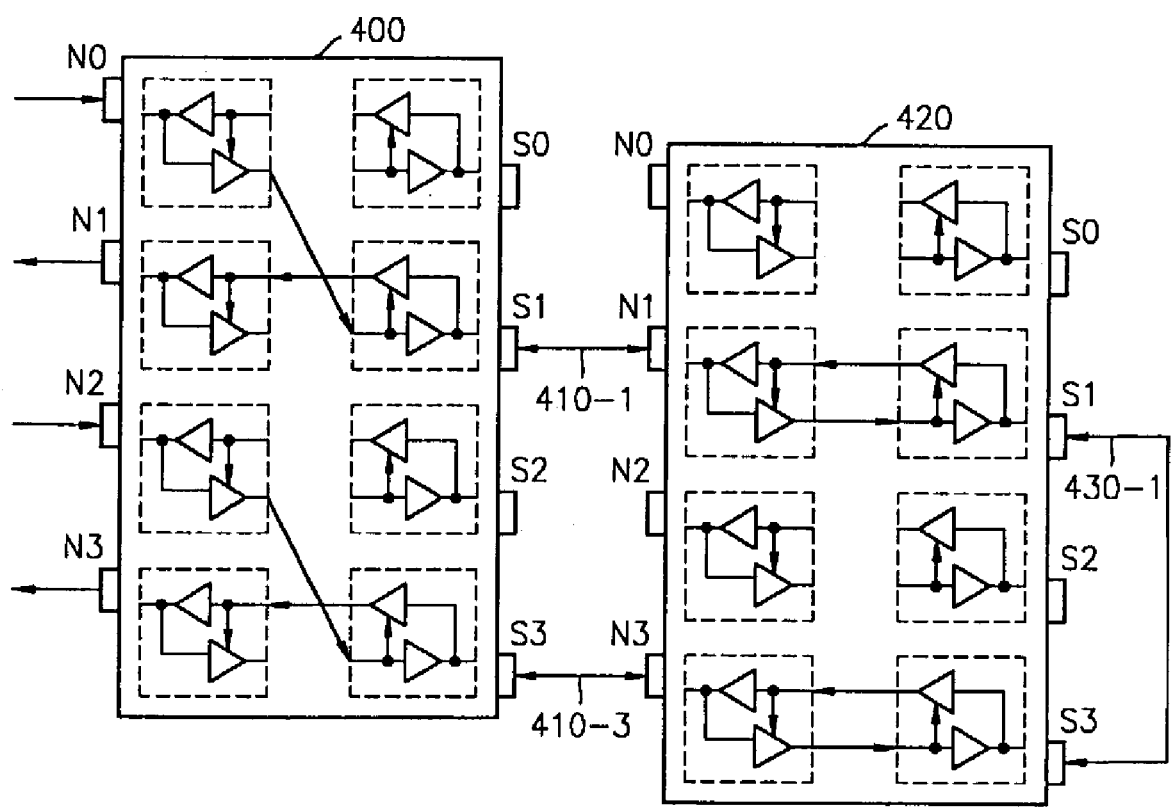
Figure 9A:
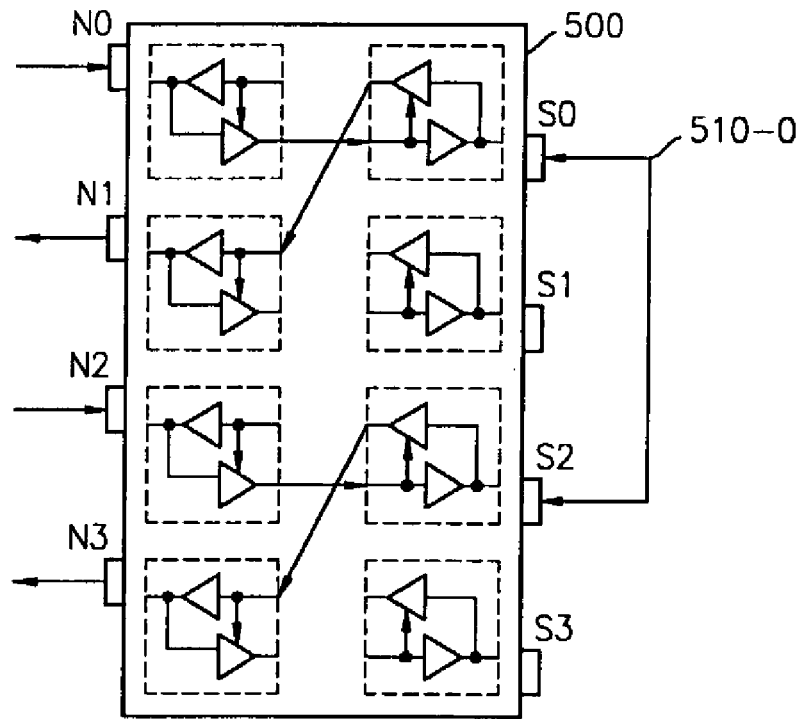
FIGS. 9A, 9B, and 9C show device testing configurations according to an embodiment of the invention, for one SBD device.
Figure 9B:
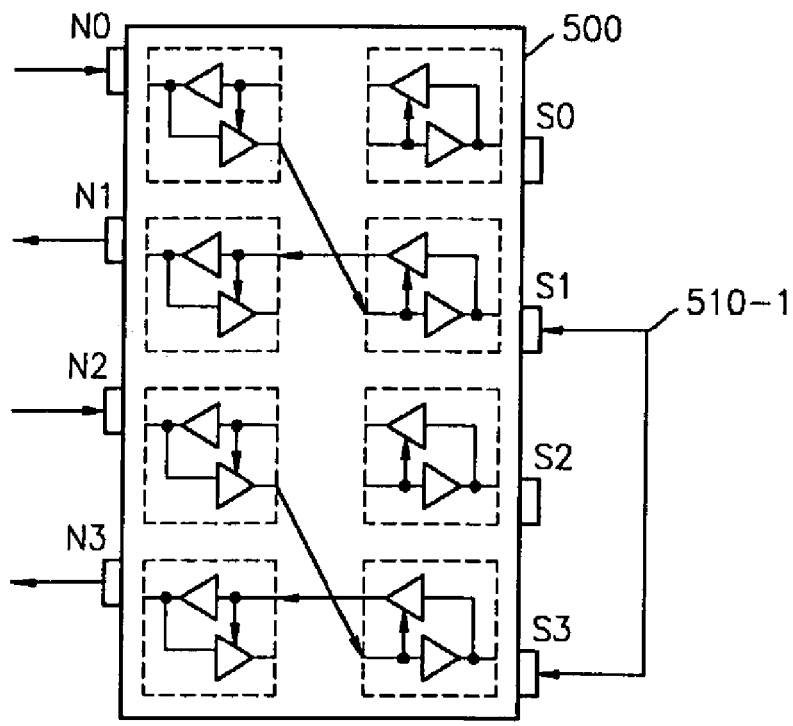
Figure 9C:
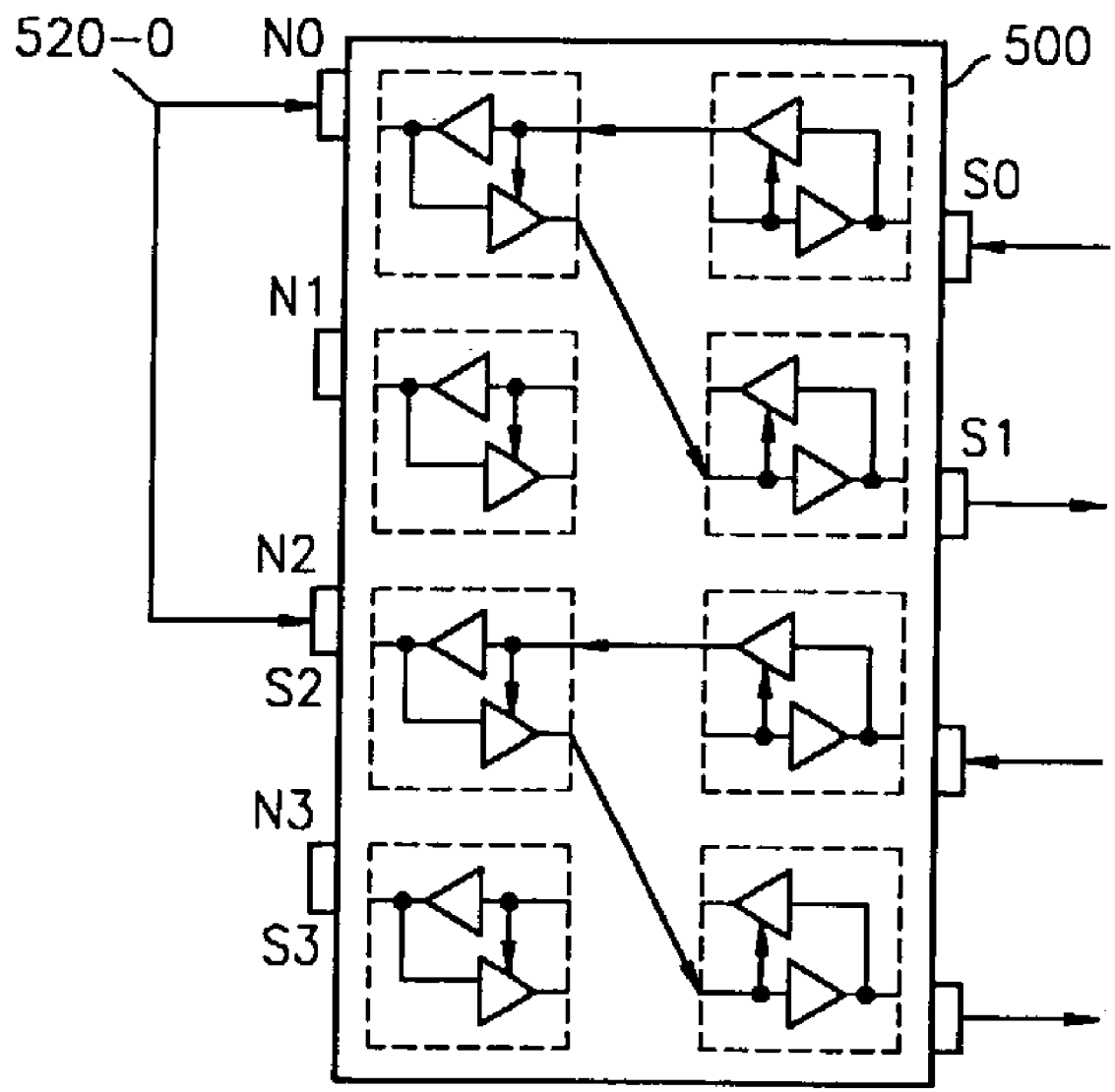

It is generally preferred to test the SBD capability of a DUT using either other DUTs or KGDs. It is possible, however, to construct device configurations where some DUT SBD port pads are paired with other SBD port pads on the same DUT. FIGS. 8A and 8B show one such configuration; FIGS. 9A, 9B, and 9C show another.

FIG. 8A, like FIG. 5A, shows a two-device test configuration. In the FIG. 8A configuration, however, the only external port is the north port of device 400. Device 400 port pads N0 and N2 receive data signals from an attached ATE; device 400 port pads N1 and N3 transmit data signals to an attached ATE.

In FIG. 8A, three internal SBD ports are present. The south port of device 400 connects with the north port of device 420 in a one-to-one port pad correspondence, e.g., device 400 port pad S0 connects to device 420 port pad N0 via a bit line 410-0, etc. The south port of device 420 connects to itself—port pad S0 connects to port pad S2 via a bit line 430-0, and port pad S1 connects to port pad S3 via a bit line 430-1.

Two test phases are used to test the SBD capability of device 420. In the first test phase, the ATE transmits a first data signal to device 400 port pad N0 and a second data signal to device 400 port pad N2. The first data signal is internally routed to device 400 port pad S0, driven on bit line 410-0 to device 420 port pad N0, internally routed to device 420 port pad S0, driven on bit line 430-0 to device 420 port pad S2, internally routed again to device 420 port pad N2, driven on bit line 410-2 to device 400 port pad S2, internally routed to device 400 port pad N3, and driven to the ATE. Simultaneously, the second data signal is internally routed to device 400 port pad S2, driven in the opposite direction on bit lines 410-2, 430-0, and 410-0 to reach device 400 port pad S0, internally routed to device 400 port pad N1, and driven to the ATE.

In the second test phase, the internal data paths of device 400 are reconfigured as shown in FIG. 8B, such that device 400 port pads S1 and S3 are the active SBD pads of device 400. Test bit patterns are driven once again to device 400, this time testing the port pads connected to bit lines 410-1, 430-1, and 410-3.

After the second test phase, all port pads of device 420 have been tested for SBD capability.

One additional test device configuration set is illustrated in FIGS. 9A, 9B, and 9C. This configuration pair contains a single device, the DUT. In FIGS. 9A and 9B, the north port of device 500 is used for unidirectional communication with an ATE, and the south port of device 500 connects to itself to form the internal port. In FIG. 9C, the south port and north port of device 500 switch roles.

Four test phases are required to test all SBD port pads. FIG. 9A illustrates the first test phase. In the first test phase, the ATE transmits a first data signal to device 500 port pad N0 and a second data signal to device 500 port pad N2. The first data signal is internally routed to device 500 port pad S0, driven on bit line 510-0 to device 500 port pad S2, internally routed to device 500 port pad N3, and driven to the ATE. Simultaneously, the second data signal is internally routed to device 500 port pad S2, driven in the opposite direction on bit line 510-0 to reach device 500 port pad S0, internally routed to device 500 port pad N1, and driven to the ATE.

In the second test phase, the internal data paths of device 500 are reconfigured as shown in FIG. 9B, such that device 500 port pads S1 and S3 are the active SBD pads of the device. Test bit patterns are driven once again to device 400, this time testing the port pads connected to bit lines 510-1.

To test the SBD capability of the north ports, the third and fourth test phases use a device configuration (the third test phase is shown in FIG. 9C) that switches the roles of the north and south ports from that of FIGS. 9A and 9B. During the third test phase, bit line 520-0 tests SBD capability between device 500 port pads N0 and N2. During the fourth test phase, a bit line (not shown) between port pads N1 and N3 is tested.

Those skilled in the art will recognize that many other device configuration permutations can be envisioned. For example, two serial DUTs could occupy the position of device 220 (FIG. 6A) or device 300 (FIG. 7). Most devices will have data port widths much larger than the four bits illustrated—the connection patterns shown can merely be repeated for each additional four-bit width at each port. Other alternate internal device cross-connection patterns and device-to-device port pad assignments are feasible, although it is believed that the simplest device layouts will generally result from pairing adjacent port pad circuitry.

Explicit instructions for construction of test boards for use with the described embodiments have been omitted. It is believed that given the device-to-device routing illustrations presented, the layout of such a test board is well within the skill of those in the applicable art.

Although the focus of the preceding description has been on SBD testing, embodiments of the present invention can be used in some instances for all testing of a DUT with a unidirectional ATE connection.

What is claimed is:

1. A method of testing a device configuration having an external data port and at least one internal data port, wherein each data port comprises multiple pads, and wherein the pads of the external and internal data ports support simultaneous bi-directional (SBD) data signaling, the method comprising:

connecting the pads of the external data port to communicate with a tester using unidirectional data signaling;
connecting at least one first internal data port pad to a second internal data port pad; and
setting internal data paths in at least one device of the device configuration to concurrently:

route a first write signal received on a first external data port pad to an output driver of the first internal data port pad, route a second write signal received on a second external data port pad to an output driver of the second internal data port pad, route a signal received by a receiver of the first internal data port pad to a third external data port pad as a first read signal, and route a signal received by a receiver of the second internal data port pad to a fourth external data port pad as a second read signal.

2. The method of claim 1, further comprising connecting at least one third internal data port pad to a fourth internal data port pad, and, after routing the first and second write signals, setting internal data paths in at least one device of the device configuration to concurrently:

route a third write signal received on the first external data port pad to an output driver of the third internal data port pad;

route a fourth write signal received on the second external data port pad to an output driver of the fourth internal data port pad;

route a signal received by a receiver of the third internal data port pad to the third external data port pad as a third read signal; and route a signal received by a receiver of the fourth internal data port pad to the fourth external data port pad as a fourth read signal.

3. The method of claim 1, further comprising connecting at least one third internal data port pad to a fourth internal data port pad, and, as part of setting the internal data path, setting internal data paths in at least one device of the device configuration to concurrently:

route a third write signal received on a fifth external data port pad to an output driver of the third internal data port pad;

route a fourth write signal received on a sixth external data port pad to an output driver of the fourth internal data port pad;

route a signal received by a receiver of the third internal data port pad to a seventh external data port pad as a third read signal; and route a signal received by a receiver of the fourth internal data port pad to an eighth external data port pad as a fourth read signal.

4. The method of claim 1, wherein the device configuration comprises a single device-under-test having first and second SBD ports:

wherein the first SBD port is designated as the external data port and the second SBD port is designated as the internal data port; and wherein connecting at least one first internal data port pad to a second internal data port pad comprises externally connecting half of the port pads of the second SBD port respectively to the other half of the port pads of the second SBD port, in a configuration such that no two port pads internally connectable to the same first SBD port are externally connected.

5. The method of claim 1, wherein the device configuration comprises first and second devices, each having first and second SBD ports:

wherein the first device first SBD port and the second device second SBD port are designated as the external data port, and the first device second SBD port and the second device first SBD port are designated respectively as first and second internal data ports;

wherein connecting at least one first internal data port pad to a second internal data port pad comprises interconnecting the pads of the first internal data port, respectively, with the pads of the second internal data port; and wherein setting internal data paths in the device configuration comprises configuring the first and second devices such that the first and third external data port pads are associated with the first device first SBD port, the second and fourth external data port pads are associated with the second device second SBD port, the first internal data port pad is associated with the first internal data port, and the second internal data port pad is associated with the second internal data port.

6. The method of claim 5, further comprising swapping at least one of the first and second devices to the position of the other device in the device configuration and repeating the steps of claim 5.

7. The method of claim 5, further comprising swapping the positions of the first and second devices in the device configuration and repeating the steps of claim 5.

8. The method of claim 1, wherein the device configuration comprises first and second devices, each having first and second SBD ports, wherein the first device is a known good device (KGD) and the second device is a device under test (DUT):

wherein the KGD first SBD port is designated as the external data port, and the KGD second SBD port and the DUT first and second SBD ports are designated respectively as first, second, and third internal data ports;

wherein connecting at least one first internal data port pad to a second internal data port pad comprises interconnecting the pads of the first internal data port, respectively, with the pads of the second internal data port, and externally connecting half of the port pads of the third internal data port respectively to the other half of the port pads of the third internal data port, in a configuration such that no two port pads internally connectable to the same second internal data port pad are externally connected; and wherein setting internal data paths in the device configuration comprises configuring the first and second devices such that the first write signal passes from the first external data port pad through a first pad of the first internal data port to a first pad of the second internal data port, through a first pad of the third internal data port to a second pad of the third internal data port, through a second pad of the second internal data port to a second pad of the first internal data port, and exits the fourth external data port pad as the second read signal, and the second write signal passes from the second external data port pad through the second pad of the first internal data port to the second pad of the second internal data port, through the second pad of the third internal data port to the first pad of the third internal data port, through the first pad of the second internal data port to the first pad of the first internal data port, and exits the third external data port pad as the first read signal.

9. The method of claim 1, wherein the device configuration comprises first and second KGDs and one DUT, each having first and second SBD ports:

wherein the first KGD first SBD port and second KGD second SBD port are designated as the external data port, and the first KGD second SBD port, the DUT first and second SBD ports, and the second KGD first SBD port are designated respectively as first, second, third, and fourth internal data ports;

wherein connecting at least one first internal data port pad to a second internal data port pad comprises interconnecting the pads of the first internal data port, respectively, with the pads of the second internal data port, and interconnecting the pads of the third internal data port, respectively, with the pads of the fourth internal data port; and wherein setting internal data paths in the device configuration comprises configuring the KGDs and the DUT such that the first write signal passes from a first external data port pad on the first KGD, through a first pad of the first internal data port to a first pad of the second internal data port, through a first pad of the third internal data port to a first pad of the fourth internal data port, and exits through a fourth external data port pad on the second KGD as the second read signal, and the second write signal passes from a second external data port pad on the second KGD, through the first pad of the fourth internal data port to the first pad of the third internal data port, through the first pad of the second internal data port to the first pad of the first internal data port, and exits the third external data port pad on the first KGD as the first read signal.

10. The method of claim 9, wherein the method simultaneously tests half of the pads of the second and third internal ports, the method further comprising internally reconfiguring at least the data paths of the first and second KGDs to simultaneously test the other half of the pads of the second and third internal ports.

11. The method of claim 1, wherein the device configuration comprises first, second, third, and fourth KGDs and one DUT, each having first and second SBD ports:

wherein the first KGD first SBD port, second KGD first SBD port, third KGD second SBD port, and fourth KGD second SBD port are designated as the external data port, and the first KGD second SBD port, second KGD second SBD port, DUT first and second SBD ports, third KGD first SBD port, and fourth KGD first SBD port are designated respectively as first, second, third, fourth, fifth, and sixth internal data ports;

wherein connecting at least one first internal data port pad to a second internal data port pad comprises interconnecting half of the pads of the first internal data port, respectively, with half of the pads of the third internal data port, interconnecting half of the pads of the second internal data port to the other half of the pads of the third internal data port, interconnecting half of the pads of the fourth internal data port to half of the pads of the fifth internal data port, and interconnecting the other half of the pads of the fifth internal data port to half of the pads of the sixth internal data port; and wherein setting internal data paths in the device configuration comprises configuring the four KGDs and the DUT such that all SBD port pads on the DUT are tested simultaneously using a number of write signals equal to the number of SBD port pads on the device under test, wherein each of the KGDs receives one-fourth of the external data port write signals and transmits one-fourth of the external data port read signals, and wherein each KGD communicates SBD data with one-fourth of the SBD port pads on the DUT.

12. A semiconductor device comprising:
a first data port and a second data port, each data port comprising at least first and second pads each supporting simultaneous bi-directional (SBD) data transmission;
a normal data path connecting the first data port with internal circuitry of the device;
a pass-through path connecting the first data port with the second data port in a first correspondence of first-data-port pads to second-data-port pads;
a test path connecting the first data port with the second data port in a second correspondence of first-data-port to second-data-port pads; and
path select circuitry to select between the pass-through path and the test path.

13. The semiconductor device of claim 12, wherein the pass-through path transmits data received at the first data port first pad to the second data port first pad, and vice-versa, and transmits data received at the first data port second pad to the second data port second pad, and vice-versa.

14. The semiconductor device of claim 13, wherein the test path comprises a first configurable test connection that transmits data received at the first data port first pad to the second data port first pad and transmits data received at the second data port first pad to the first data port second pad.

15. The semiconductor device of claim 14, wherein the test path further comprises a second configurable test connection that transmits data received at the first data port first pad to the second data port second pad and transmits data received at the second data port second pad to the first data port second pad.

16. The semiconductor device of claim 12, wherein the path select circuitry comprises a set of cross-connecting switching elements configurable to allow data to pass between the first data port pads and the second data port pads in a plurality of two-pad to one-pad mappings.

17. The semiconductor device of claim 16, wherein each two-pad to one-pad mapping allows unidirectional data received and transmitted, respectively, on two pads of one of the data ports to be converted to bi-directional data received and transmitted on one pad of the other data port.

18. The semiconductor device of claim 16, wherein the set of cross-connecting switching elements are also configurable according to at least one one-pad to one-pad bi-directional mapping between the first data port pads and the second data port pads.

19. The semiconductor device of claim 16, each data port pad having a corresponding SBD receiver and driver, each receiver connecting to two switched paths to drivers for two data port pads on the opposite data port.

20. The semiconductor device of claim 19, the path select circuitry comprising path-switching elements between the first data port and the second data port, wherein the path select circuitry further comprises a test mode register, the test mode register generating at least one test mode signal to operate path-switching elements.

* * * * *

UNITED STATES PATENT AND TRADEMARK OFFICE
CERTIFICATE OF CORRECTION

PATENT NO.       : 7,131,042 B2                                        Page 1 of 1
APPLICATION NO.  : 10/421533
DATED            : October 31, 2006
INVENTOR(S)      : Jung-Hwan Choi It is certified that error appears in the above-identified patent and that said Letters Patent is hereby corrected as shown below:

Column 1, line 44, the word "Vref1" should read -- VrefH --;
Column 7, line 14, the word "SO" should read -- S0 --.

Signed and Sealed this

Second Day of September, 2008

JON W. DUDAS
*Director of the United States Patent and Trademark Office*